United States Patent
Xin-Shan et al.

(10) Patent No.: US 7,411,339 B2
(45) Date of Patent: Aug. 12, 2008

(54) MANUFACTURING METHOD OF ACTUATOR DEVICE AND LIQUID JET APPARATUS PROVIDED WITH ACTUATOR DEVICE FORMED BY MANUFACTURING METHOD OF THE SAME

(75) Inventors: Li Xin-Shan, Nagano-ken (JP); Hironobu Kazama, Nagano-ken (JP); Masami Murai, Nagano-ken (JP); Koji Sumi, Nagano-ken (JP); Maki Ito, Nagano-ken (JP); Toshiaki Yokouchi, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 511 days.

(21) Appl. No.: 10/995,945

(22) Filed: Nov. 24, 2004

(65) Prior Publication Data

US 2005/0168524 A1    Aug. 4, 2005

(30) Foreign Application Priority Data

Nov. 28, 2003   (JP)   ............................. 2003-399846
Dec. 8, 2003    (JP)   ............................. 2003-409629

(51) Int. Cl.
*H01L 41/187*   (2006.01)

(52) U.S. Cl. ..................................................... 310/358
(58) Field of Classification Search ................. 310/328, 310/358
See application file for complete search history.

(56) References Cited

U.S. PATENT DOCUMENTS

| 6,354,836 B1 * | 3/2002 | Panzera et al. ............... 433/215 |
| 2003/0063165 A1 * | 4/2003 | Shimada ....................... 347/70 |

FOREIGN PATENT DOCUMENTS

| JP | 11-204849 A | 7/1999 |
| JP | 2002-29840 A * | 1/2002 |

* cited by examiner

*Primary Examiner*—Thomas M Dougherty
(74) *Attorney, Agent, or Firm*—Sughrue Mion, PLLC (57) ABSTRACT

A manufacturing method of a liquid jet head having increased the durability and reliability thereof by preventing delamination of a vibration plate is provided. At least the following two steps are included: a vibration plate forming step which includes at least a step of forming a zirconium layer on one side of a passage-forming substrate by sputtering so that a degrees of orientation to a (002) plane of the surface becomes equal to 80% or more, as well as forming an insulation film made of zirconium oxide and constituting a part of the vibration plate by subjecting the zirconium layer to thermal oxidation; and a piezoelectric element forming step of forming piezoelectric elements on the vibration plate.

7 Claims, 10 Drawing Sheets

ZrO2[Zr degrees of orientation to the (002) plane: 80%]

FIG.9B

ZrO2[Zr degrees of orientation to the (002) plane: 90%]

FIG.9C

ZrO2[Zr degrees of orientation to the (002) plane: 99.7%]

FIG.10

ZrO2[Zr degrees of orientation to the (002) : 99.7%]

FIG.11

ZrO2[Zr degrees of orientation to the (002) : 90.0%]

FIG.12

MANUFACTURING METHOD OF ACTUATOR DEVICE AND LIQUID JET APPARATUS PROVIDED WITH ACTUATOR DEVICE FORMED BY MANUFACTURING METHOD OF THE SAME

BACKGROUND OF THE INVENTION

1. Field of the Invention

The present invention relates to a manufacturing method of an actuator device, in which a vibration plate is provided on a surface of a passage-forming substrate including pressure generating chambers and in which piezoelectric elements are formed on the vibration plate, and relates to a liquid jet apparatus, in which droplets such as ink are ejected by displacement of the actuator device formed by the manufacturing method.

2. Description of the Related Art

An actuator device including piezoelectric elements which undergo displacement by being applied with voltage is applied to, for example, a liquid jet head ejecting droplets and the like. As the liquid jet head as described above, an inkjet recording head is known, for example. In the inkjet recording head, a part of pressure generating chambers communicating with nozzle orifices is formed by a vibration plate, and this vibration plate is deformed by piezoelectric elements to elect ink droplets from the nozzle orifices by pressurizing ink in the pressure generating chambers. There are two types of inkjet recording heads which have been put to practical use, which include: one applying a piezoelectric actuator device of a longitudinal vibration mode configured to expand and contract in an axial direction of the piezoelectric element; and one applying a piezoelectric actuator device of a flexural vibration mode.

In the former, volume of the generating chambers can be varied by making an end face of the piezoelectric elements abut on the vibration plate, and a head suitable for high-density printing can be manufactured. However, there arise the following problems: A troublesome process of making the piezoelectric elements correspond with an arrangement pitch of the nozzle orifices and cutting them into comb-like shapes becomes necessary; an operation of specifying and fixing the piezoelectric elements cut as described above for the pressure generating chambers also becomes necessary; and accordingly, the manufacturing process is complicated. Meanwhile, in the latter, the piezoelectric elements can be formed on the vibration plate by a relatively simple process, in which a green sheet as a piezoelectric material is attached in conformity to the shape of the pressure generating chambers and baked. However, there arises a problem that a high-density arrangement of the piezoelectric elements is difficult to perform since a certain area becomes necessary in applying the flexural vibration mode. Moreover, in order to eliminate the disadvantage of the latter, there is a type of head in which a uniform piezoelectric material layer is formed over an entire surface of a vibration plate by use of a deposition technique, this piezoelectric material layer is cut into shapes corresponding to the pressure generating chambers by use of a lithography method, and piezoelectric elements are formed so as to be independent for each of the pressure generating chambers.

As a material of the piezoelectric material layer constituting piezoelectric elements as described above, for example, lead zirconate titanate (PZT) is used. In this case, when the piezoelectric material layer is baked, lead components of the piezoelectric material layer diffuse in a silicon dioxide ($SiO_2$) film which is formed on a surface of the passage-forming substrate made of silicon (Si) and constitutes the vibration plate. Thus, there arises a problem that a melting point of silicon dioxide decreases due to the diffusion of the lead components and thereby the silicon dioxide film melts due to the heat generated in baking the piezoelectric material layer. In order to solve the problems as described above, for example, there is one in which the zirconium oxide film constituting the vibration plate is formed on the silicon dioxide film and the piezoelectric material layer is formed on this zirconium oxide film to prevent the lead components from diffusing from the piezoelectric material layer to the silicon dioxide film (for example, see Japanese Unexamined Patent Publication No.11 (1999)-204849).

However, the zirconium oxide film has low adhesion properties with silicon dioxide film and therefore there arises a problem that delamination of the vibration plate or the like occurs. Namely, the zirconium oxide film is formed by forming a zirconium film by sputtering and thereafter subjecting the zirconium film to thermal oxidation. The zirconium film formed as described above takes the form of polycrystalline structure, but the crystals are likely to be formed into ball-shaped ones. Accordingly, even if there are column-shaped crystals, the rate of existence thereof is low, and therefore there arises a problem that the zirconium oxide film has low adhesion properties with silicon dioxide film and the delamination of the zirconium oxide film or the like occurs. Note that such problems as described above similarly arise not only in the actuator device applied to the liquid jet head such as the inkjet recording head but also in actuator devices applied to other apparatus.

SUMMARY OF THE INVENTION

In consideration of the circumstances as described above, an object of the present invention is to provide a manufacturing method of an actuator device having increased the durability and reliability thereof by preventing delamination of the vibration plate and a liquid jet apparatus provided with an actuator device formed by the manufacturing method.

To attain the object, a first aspect of the present invention provides a manufacturing method of an actuator device including a vibration plate provided on one side of a passage-forming substrate in which pressure generating chambers are arranged, and piezoelectric elements formed of a lower electrode, a piezoelectric layer, and an upper electrode, which are formed on the vibration plate. The manufacturing method includes at least: a vibration plate forming step which includes at least a step of forming a zirconium layer on one side of the passage-forming substrate by sputtering so that a degress of orientation to a (002) plane of a surface becomes equal to 80% or more as well as forming an insulation film made of zirconium oxide and constituting a part of the vibration plate by subjecting the zirconium layer to thermal oxidation; and piezoelectric element forming step of forming piezoelectric elements on the vibration plate.

In the first aspect, a zirconium layer having excellent crystallinity can be formed, and an insulation film having excellent adhesion properties with a film under the insulation film can be formed by subjecting the zirconium layer formed as described above to thermal oxidation.

A second aspect of the present invention provides a manufacturing method of an actuator device according to the first aspect, in which the vibration plate forming step further includes a step of forming an elastic film made of silicon dioxide ($siO_2$) and constituting a part of the vibration plate on one side of the passage-forming substrate made of a single crystal silicon substrate, and in which the insulation film is formed on the elastic film.

In the second aspect, even if a film under the insulation film is the elastic film made of silicon dioxide, the adhesion properties therebetween are increased.

A third aspect of the present invention provides a manufacturing method of an actuator device according to any one of the first and second-aspects, in which the piezoelectric element forming step includes at least a step of forming a piezoelectric layer made of lead zirconate titanate (PZT).

In the third aspect, diffusion of lead components of the piezoelectric layer in a vibration plate can be prevented, and the vibration plate and the piezoelectric elements can be formed favorably.

A fourth aspect of the present invention provides a manufacturing method of an actuator device according to any one of the first to third aspects, in which the zirconium layer is formed by use of a DC sputtering method in the step of forming the insulation film.

In the fourth aspect, a zirconium layer having a degrees of orientation to a (002) plane of the surface equal to 80% or more can be formed relatively easily.

A fifth aspect of the present invention provides a manufacturing method of an actuator device according to the fourth aspect, in which sputtering output in forming the zirconium layer is set to 500 W or below.

In the fifth aspect, a zirconium layer having excellent crystallinity can be formed by controlling the sputtering output.

A sixth aspect of the present invention provides a manufacturing method of an actuator device according to any one of the fourth and fifth aspects, in which a heating temperature in forming the zirconium layer is set to 100 degrees C. or more.

In the sixth aspect, a zirconium layer having excellent crystallinity can be formed by controlling the heating temperature in sputtering.

A seventh aspect of the present invention provides a manufacturing method of an actuator device according to any one of the fourth to sixth aspects, in which sputtering pressure in forming the zirconium layer is set to 0.5 Pa or below.

In the seventh aspect, a zirconium layer having excellent crystallinity can be formed by controlling the sputtering pressure.

An eighth aspect of the present invention provides the manufacturing of an actuator device according to any one of the first to seventh aspects, in which a temperature of thermal oxidation is set to 850 to 1000° C., and a load speed is set to 300 mm/min or more.

In the eighth aspect, the insulation film which is subjected to priority orientation to the (−111) plane and in which crystalline state is favorable, can be obtained.

A ninth aspect of the present invention provides an actuator device including a vibration plate, and piezoelectric elements formed of a lower electrode, a piezoelectric layer, and an upper electrode which are formed on the vibration plate, in which the vibration plate includes at least an insulation film made of zirconium oxide ($ZrO_2$), and crystals of the insulation film are subjected to priority orientation to a (−111) plane.

In the ninth aspect, quality of the insulation film is increased, and delamination of the vibration plate is prevented. Moreover, quality of the respective layers such as the piezoelectric layer and the like which are formed on this insulation film is stabilized by the increase in the quality of the insulation film.

A tenth aspect of the present invention provides an actuator device according to the ninth aspect, in which crystals of the insulation film are column-shaped.

In the tenth aspect, the crystals of the insulation film are formed into column-shaped ones continuously from an undersurface to a top surface, and thereby adhesion properties between the undersurface and the top surface are increased.

An eleventh aspect of the present invention provides an actuator device according to any one of the ninth and tenth aspects, in which the crystals of the insulation film are monoclinic.

In the eleventh aspect, the crystals of the insulation film are orientated to a (−111) plane favorably.

A twelfth aspect of the present invention provides an actuator device according to any one of the ninth to eleventh aspects, in which film thickness of the insulation film is 200 nm or more, and grain size is 20 to 100 nm.

In the twelfth aspect, adhesion properties between the insulation film and layers sandwiching the insulation film are surely increased.

A thirteenth aspect of the present invention provides an actuator device according to any one of the ninth to twelfth aspects, in which a stress of the insulation film is in a range of −150 to −300 [MPa].

In the thirteenth aspect, delamination of the insulation film can be surely prevented. Moreover, displacement of a vibration plate due to drive of piezoelectric elements can be prevented from decreasing.

A fourteenth aspect of the present invention provides an actuator device according to any one of the ninth to thirteenth aspects, in which the vibration plate includes an elastic film made of silicon dioxide ($SiO_2$), and the insulation film is formed on the elastic film.

In the fourteenth aspect, even if a film under the insulation film is the elastic film made of silicon dioxide, the adhesion properties therebetween are increased.

A fifteenth aspect of the present invention provides a liquid jet apparatus, in which the liquid jet head having the actuator device formed by the manufacturing method according to the first aspect is provided.

In the fifteenth aspect, a liquid jet apparatus having increased the durability and reliability thereof can be achieved.

A sixteenth aspect of the present invention provides a liquid jet apparatus, in which the liquid jet head having the actuator device according to the ninth aspect is provided.

In the sixteenth aspect, a liquid jet apparatus having increased the durability and reliability thereof can be achieved.

DETAILED DESCRIPTION OF THE PREFERRED EMBODIMENTS

The present invention will be described in detail below based on embodiments.

Embodiment 1

Figure 1:
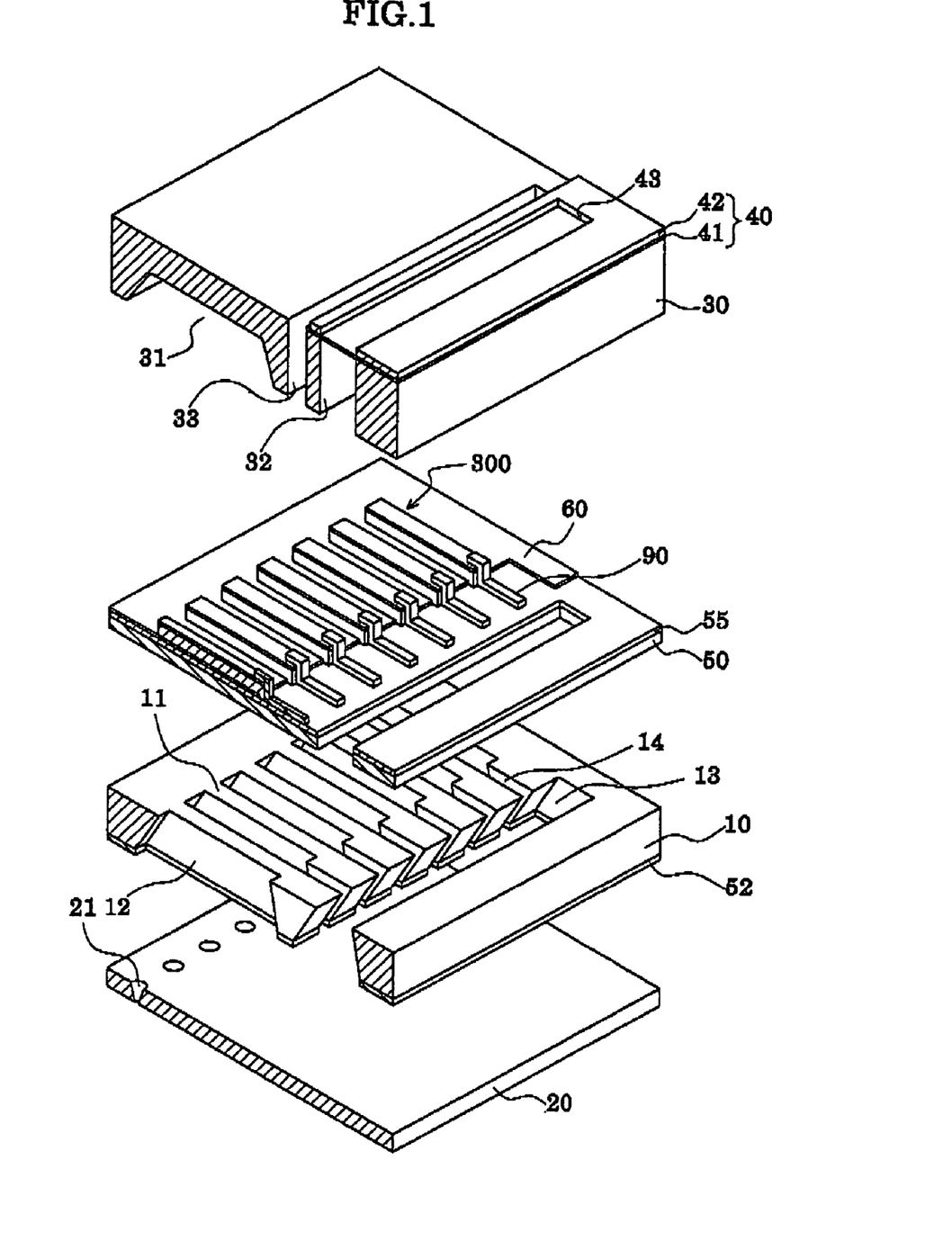
FIG. 1 is an exploded perspective view of a recording head according to Embodiment 1.
Figure 2A:
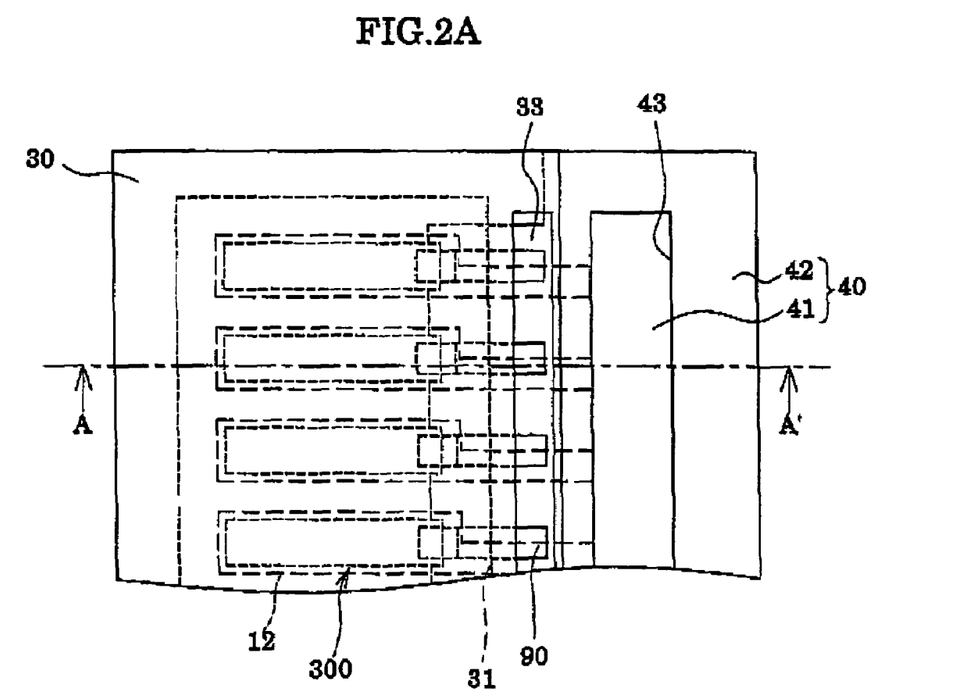
FIG. 2A is a plan view and FIG. 2B is a cross-sectional view of the recording head according to Embodiment 1.
Figure 2B:
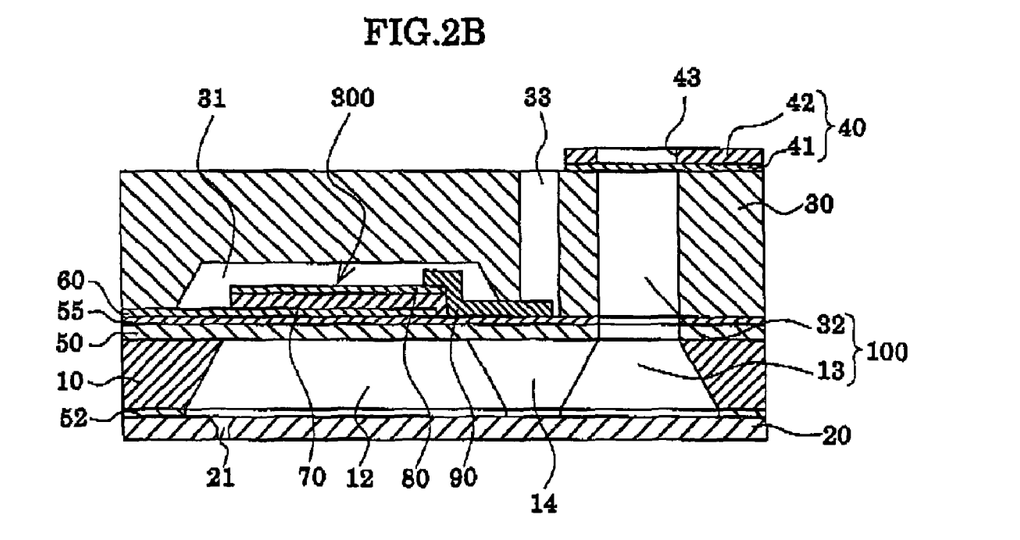

FIG. 1 is an exploded perspective view showing an inkjet recording head provided with an actuator device according to Embodiment 1 of the present invention. FIGS. 2(a) and 2(b) are a plan and cross-sectional view of FIG. 1. As shown in FIG. 1, a passage-forming substrate 10 is made of a single crystal silicon substrate of plane orientation (110) in this embodiment, and on one surface thereof, an elastic film 50 with a thickness of 1 to 2 μm, which is made of silicon dioxide and previously formed by thermal oxidation, is formed. In this passage-forming substrate 10, a plurality of pressure generating chambers 12 are arranged in a width direction thereof. Moreover, on the outside in a longitudinal direction of the pressure generating chambers 12 in the passage-forming substrate 10, a communicating portion 13 is formed. The communicating portion 13 and the respective pressure generating chambers 12 are communicated with each other through ink supply paths 14, each of which is provided for each of the pressure generating chambers 12. Note that the communicating portion 13 communicates with a reservoir portion in a protective plate to be described later, and constitutes a part of a reservoir to be a common ink chamber of the respective pressure generating chambers 12. Moreover, each of the ink supply paths 14 is formed to have a width narrower than that of a pressure generating chamber 12. Accordingly, a passage resistance of ink flowing into a pressure generating chamber 12 from the communicating portion 13 is maintained constant.

Moreover, on the opening surface side of the passage-forming substrate 10, a nozzle plate 20 having nozzle orifices 21 drilled therein is fixed by use of an adhesive agent, a thermowelding film or the like, with a mask film to be described later interposed therebetween. The nozzle orifices 21 communicate with the vicinity of end portions of the pressure generating chambers 12 at the side opposite to the ink supply paths 14. Note that the nozzle plate 20 is made of glass ceramics, single crystal silicon substrate, stainless steel, or the like, having a thickness of, for example, 0.01 to 1 mm and a linear expansion coefficient of, for example, 2.5 to 4.5 [×10$^{-6}$/degrees C.] at 300 degrees C. or less.

Meanwhile, as described above, an elastic film 50 made of silicon dioxide ($SiO_2$) and having a thickness of about 1.0 μm, for example, is formed on a side opposite to the opening surface of the passage-forming substrate 10. An insulation film 55 made of zirconium oxide ($ZrO_2$), that is, monoclinic zirconium oxide in this embodiment, for example, is formed on this elastic film 50. Moreover, as described in detail in, aforementioned insulation film 55 is formed by subjecting a zirconium layer having a degrees of orientation to a (002) plane equal to 80% or more to thermal oxidation. The crystals of the insulation film 55 formed as described above according to this embodiment are subjected to priority orientation to a (−111) plane and formed into column-shaped crystals.

In such a configuration as described above, adhesion properties between the insulation film 55 and the elastic film 50 are increased to a large extent. Accordingly, the delamination of the vibration plate or the like can be prevented from occurring, Moreover, quality of the respective layers formed on this insulation film 55 can be stabilized. Accordingly, an inkjet recording head having increased the durability and reliability thereof can be achieved.

Note that the priority orientation means a state where the orientation of the crystals is not unregulated but a specific crystal plane is orientated to a predetermined direction substantially. In this embodiment, for example, the plane (−111) of the crystals of zirconium oxide is orientated to a front side of the insulation film 55. A film in which crystals are column-shaped means a state where substantially circular column-shaped crystals gather along the plane direction with their central axes approximately corresponding to the thickness direction to form a film.

Moreover, the insulation film 55 as described above is preferably formed with the thickness of at least 200 nm or more, In this embodiment, for example, the insulation film 55 is formed with the thickness of about 400 nm. Note that the insulation film 55 plays a role in preventing the diffusion of lead components in the elastic film 50 when the piezoelectric layer is formed. If the insulation film 55 is formed with the thickness of 200 nm or more, the diffusion of lead components in the elastic film 50 can be surely prevented.

Furthermore, the grain size of the insulation film 55 (zirconium oxide) is preferably controlled as appropriate depending on the thickness of the insulation film 55, specifically, in a range of 20 nm to 100 nm, for example. Accordingly, the adhesion properties between the insulation film 55 and the elastic film 50 are further increased. Additionally, the stress of the insulation film 55 is preferably in a range of −150 to −300 [MPa], that is, the stress in a tensile direction is preferably in a range of 150 to 300 [Mpa]. By setting the stress to the above-described extent, a crack or the like does not occur in the insulation film 55, thus improving yield to a large extent.

Moreover, on the insulation film 55, a lower electrode film 60 having a thickness of about 0.2 μm, for example, a piezoelectric layer 70 having a thickness of about 1.0 μm, for example, and an upper electrode film 80 having a thickness of about 0.05 μm, for example, are formed and laminated in a process to be described later. Accordingly, these constituents collectively constitute a piezoelectric element 300. Here, the piezoelectric element 300 means a portion including the lower electrode film 60, the piezoelectric layer 70, and the upper electrode film 80. In general, one of the electrodes in the piezoelectric element 300 is defined as a common electrode, and the other electrode and the piezoelectric layer 70 are patterned for the respective pressure generating chambers 12. Moreover, the portion including one of the electrodes which has been patterned and piezoelectric layer 70, and exhibiting piezoelectric strain by application of a voltage to the both electrodes, is herein referred to as a piezoelectric active portion. In this embodiment, the lower electrode film 60 is used as the common electrode of the piezoelectric element 300, and the upper electrode film 80 is used as an individual electrode of the piezoelectric element 300. However, it is possible to invert the functions of these electrode films due to convenience for designing driving circuits or wiring. In any case, the piezoelectric active portion is formed for each of the pressure generating chambers. Meanwhile, the piezoelectric element 300 and a vibration plate undergoing displacement by a drive of the piezoelectric element 300 are herein collectively referred to as a piezoelectric actuator. Note that, in this embodiment, the elastic film, the insulation film and the lower electrode film function as the vibration plate. However, as a matter of course, it may be configured so that only the elastic film and the insulation film function as the vibration plate.

Moreover, lead electrodes 90 made of gold (Au) or the like, for example, are respectively connected to the upper electrode films 80 of the respective piezoelectric elements 300 as described above, and voltages are to be selectively applied to the respective piezoelectric elements 300 through the lead electrodes 90.

Meanwhile, a protective plate 30 having a piezoelectric element holding portion 31 capable of securing a sufficient space in a region facing the piezoelectric elements 300 so as not to inhibit actions thereof is joined onto a surface of the passage-forming substrate 10 on the piezoelectric element 300 side. The piezoelectric elements 300 are formed inside this piezoelectric element holding portion 31, and thus are protected in a state where the piezoelectric elements 300 are not substantially susceptible to influences from external environments. Moreover, a reservoir portion 32 is provided for the protective plate 30 in a region corresponding to the communicating portion 13 of the passage-forming substrate 10. In this embodiment, the reservoir portion 32 is provided along the direction of arrangement of the pressure generating chambers 12 while penetrating the protective plate 30 in the thickness direction, and is communicated with the communicating portion 13 of the passage-forming substrate 10 as described above. In this way, the communicating portion 13 and the reservoir portion 32 collectively constitute a reservoir 100 to be the common ink chamber for the respective pressure generating chambers 12.

Meanwhile, a through-hole 33 is provided in a region between the piezoelectric element holding portion 31 and reservoir portion 32 of the protective plate 30 so as to penetrate the protective plate 30 in its thickness direction. Parts of the lower electrode film 60 and heads of the lead electrodes 90 are exposed inside this through-hole 33. Although not illustrated in the drawing, ends of connection wiring extending from a driving IC are connected to the lower electrode film 60 and to the lead electrodes 90.

Here, the material for the protective plate 30 may be, for example, glass, a ceramic material, metal, resin, or the like. However, it is preferable to form the protective plate 30 by use of a material having substantially the same coefficient of thermal expansion as that of the passage-forming substrate 10. In this embodiment, the protective plate 30 is formed by use of a single crystal silicon substrate which is the same material as that of the passage-forming substrate 10.

Meanwhile, a compliance plate 40 including a sealing film 41 and a fixing plate 42 is joined onto the protective plate 30. The sealing film 41 is made of a material having low stiffness and sufficient flexibility (a polyphenylene sulfide (PPS) film having a thickness of 6 μm, for example). One side of the reservoir portion 32 is sealed by this sealing film 41. Meanwhile, the fixing plate 42 is made of a hard material such as metal (stainless steel (SUS) having a thickness of 30 μm or the like, for example). A region of this fixing plate 42 facing the reservoir 100 is completely removed in its thickness direction and is thereby formed into an opening portion 43. Accordingly, one side of the reservoir 100 is sealed only by the flexible sealing film 41.

In the inkjet recording head of this embodiment described above, ink is taken in from unillustrated external ink supplying means, and all the inside from the reservoir 100 to the nozzle orifices 21 is filled with the ink. Then, voltages are applied respectively between the lower electrode film 60 and the upper electrode films 80 corresponding to the pressure generating chambers 12 in accordance with recording signals from unillustrated driving IC, whereby the elastic film 50, the insulation film 55, the lower electrode film 60, and the piezoelectric layers 70 are subjected to flexural deformation. Accordingly, pressure in each of the pressure generating chambers 12 is increased and ink droplets are ejected from the nozzle orifices 21.

Figure 3A:
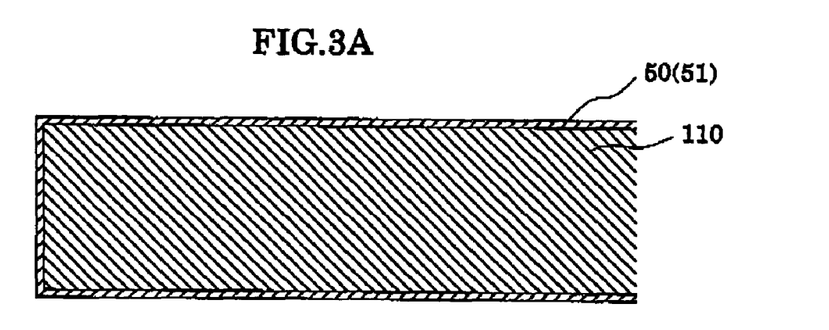
FIGS. 3A to 3D are cross-sectional views showing a manufacturing process of the recording head according to Embodiment 1.

Now, a method of manufacturing the inkjet recording head as described above will be described with reference to FIG. 3A to FIG. 5B. FIG. 3A to FIG. 5B are cross-sectional views of the pressure generating chamber 12 in the longitudinal direction. First, as shown in FIG. 3A, a passage-forming substrate wafer 110 which is a silicon wafer is subjected to thermal oxidation in a diffusion furnace set to a temperature of about 1100 degrees C., and a silicon dioxide film 51 constituting the elastic film 50 is formed on a surface thereof. Note that, in this embodiment, a relatively thick and stiff silicon wafer having a film thickness of about 625 μm is used as the passage-forming substrate wafer 110.

Figure 3B:
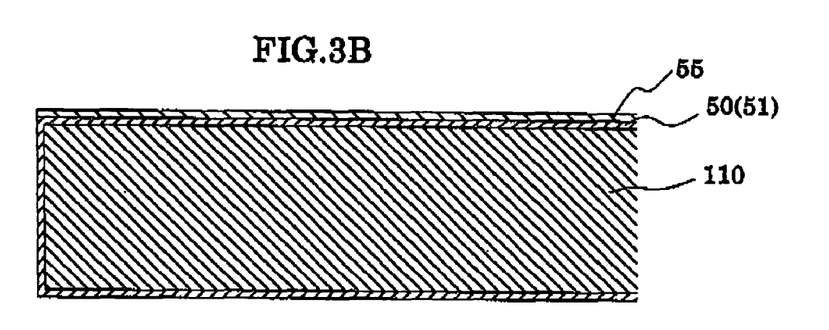
Figure 3C:
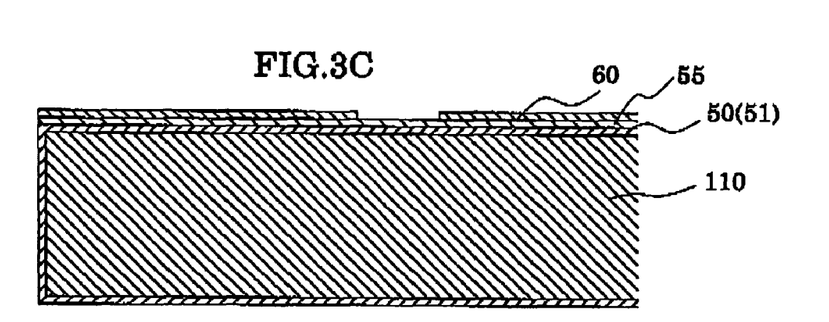

Subsequently, as shown in FIG. 3B, the insulation film 55 made of zirconium oxide is formed on the elastic film 50 (the silicon dioxide film 51). To be more precise, a zirconium layer is firstly formed on the elastic film 50 by use of a sputtering method, that is, in this embodiment, a DC sputtering method, for example. At this time, the zirconium layer is formed by use of predetermined sputtering conditions, and the degrees of orientation to the (002) plane of the surface of the zirconium layer is set to 80% or more, or preferably to 90% or more.

Figure 6:
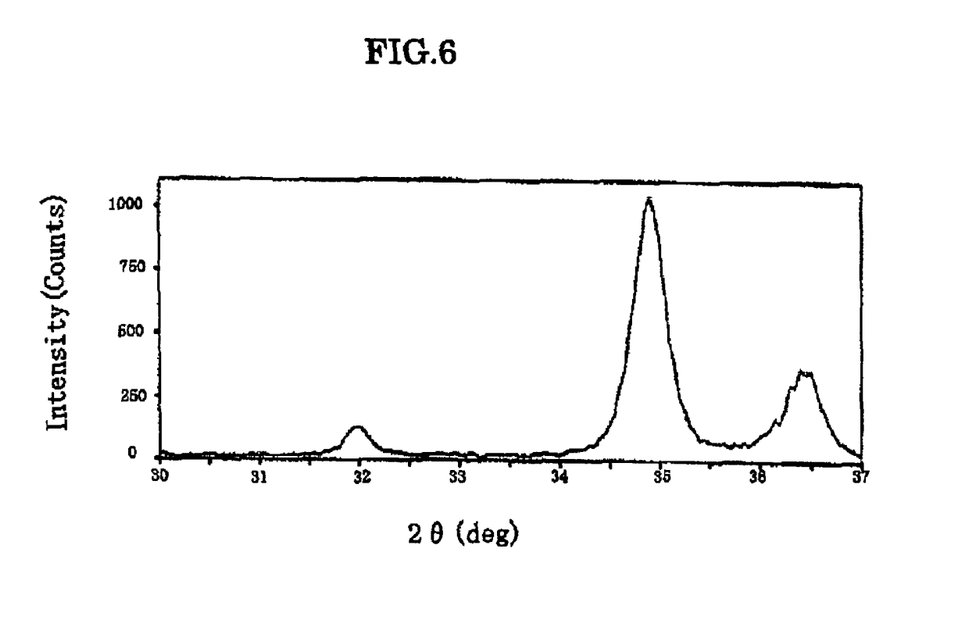
FIG. 6 is a graph showing an example of an X-ray diffraction measurement result of a zirconium layer.

Here, the "degrees of orientation" means a ratio of diffraction intensity generated when the zirconium layer is measured by use of a wide angle X-ray diffraction method. Specifically, when the zirconium layer is measured by use of the wide angle X-ray diffraction method, peaks of diffraction intensity corresponding to the (100) plane, the (002) plane, and the (101) plane are observed. For example, the X-ray diffraction measurement result of the zirconium layer having a degrees of orientation to the (002) plane equal to approximately 70% is shown in FIG. 6. It is understood that the peaks of intensity are observed at the portion corresponding to the (100) and (101) planes as well as the portion corresponding to the (002) plane. The "degrees of orientation to the (002) plane" means a ratio of the peak intensity corresponding to the (002) plane relative to the sum of the peak intensities corresponding to the respective planes.

Furthermore, in order to obtain the zirconium layer having a degrees of orientation to the (002) plane equal to 80% or more as described above, the output in forming the zirconium layer by use of the DC sputtering method is preferably set to 500 W or below. Additionally, a heating temperature in sputtering is preferably set to 100 degrees C. or higher. However, if the heating temperature is too high, the passage-forming substrate 10 may produce cracks or the like therein, and therefore the heating temperature is preferably set to 100 to 300 degrees C. Moreover, sputtering pressure is preferably set to 0.5 Pa or below. By selecting deposition conditions as appropriate and forming the zirconium layer by use of the DC sputtering method as described above, the zirconium layer having a degrees of orientation to the (002) plane of the surface equal to 80% or more can be surely formed.

Then, by subjecting the zirconium layer having a degrees of orientation to the (002) plane equal to 80% or more to thermal oxidation as described above, the insulation film 55 made of zirconium oxide is formed. Specifically, in a diffusion furnace heated to a temperature of about 850 to 1000 degrees C., for example, the passage-forming substrate wafer 110 is inserted at the speed (load speed) of 300 m/min or more, or preferably 500 mm/min or more, and the zirconium layer is subjected to thermal oxidation. Thereby, the insulation film 55, which is subjected to priority orientation to the (−111) plane and in which crystalline state is favorable, can be obtained. Additionally, the crystals of zirconium oxide constituting the insulation film 55 formed as described above are formed into column-shaped ones continuously from the undersurface to the top surface.

Figure 7:
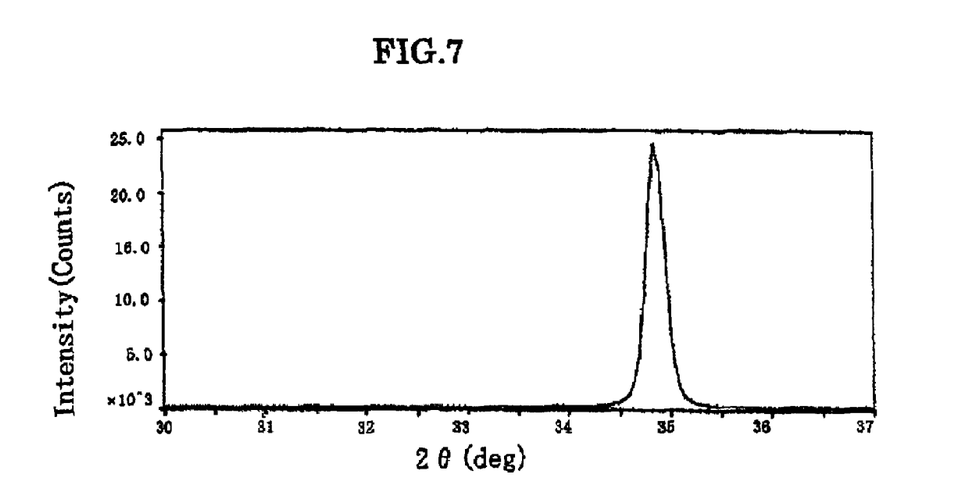
FIG. 7 is a graph showing an X-ray diffraction measurement result of a zirconium layer according to Embodiment 1.
Figure 8:
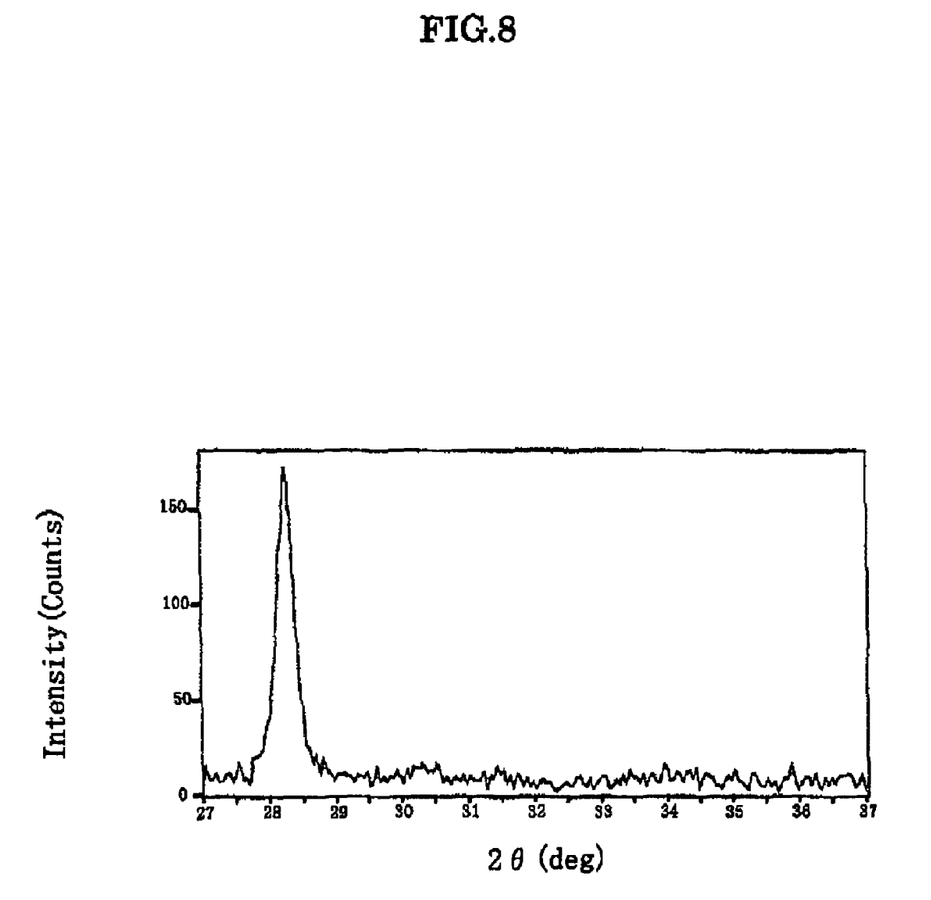
FIG. 8 is a graph showing an X-ray diffraction measurement result of a zirconium oxide layer according to Embodiment 1.
Figure 9A:
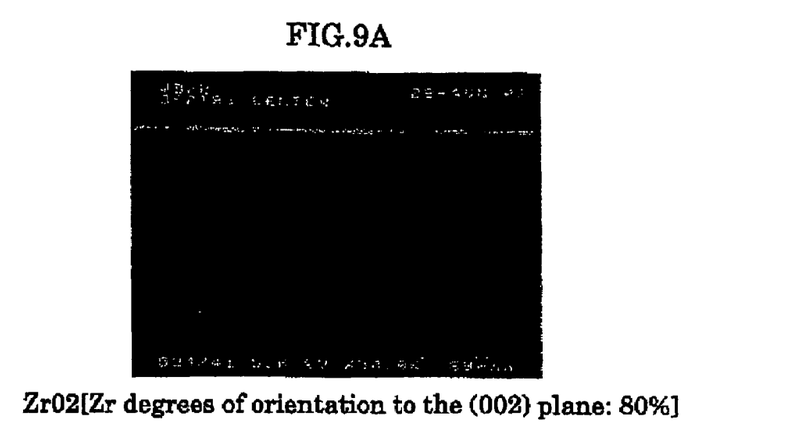
FIGS. 9A to 9C are scanning electron microscopic images showing cross-sections of zirconium oxide layers according to Embodiment 1.
Figure 9B:
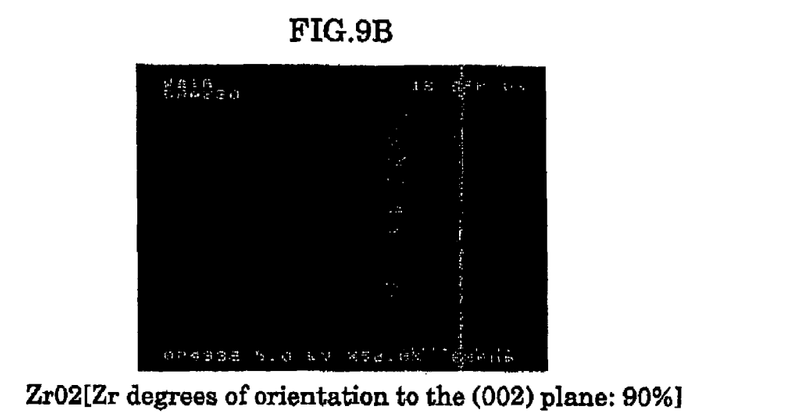
Figure 9C:
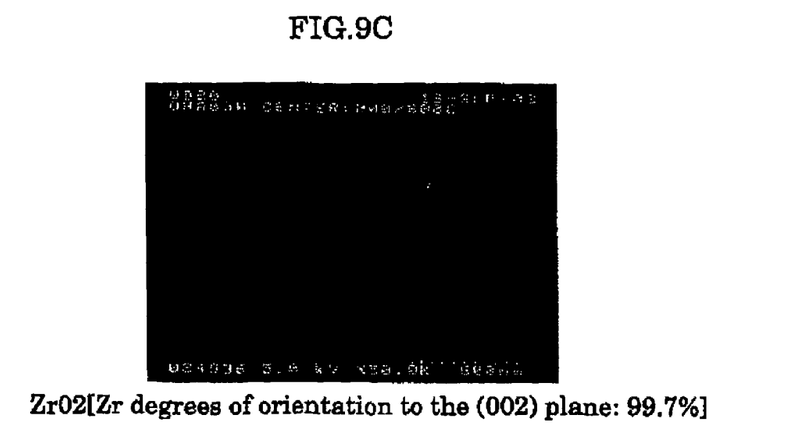

Here, the X-ray diffraction measurement result of the zirconium layer formed on a predetermined plate under the sputtering conditions shown in Table 1 is shown in FIG. 7. In addition, the X-ray diffraction measurement result of the zirconium oxide layer formed by subjecting the above-described zirconium layer to thermal oxidation is shown in FIG. 8. Cross-sectional scanning electron microscopic (SEM) images of zirconium oxide layers are shown in FIGS. 9A to 9C. The zirconium oxide layers are formed by subjecting respective zirconium layers, each of which has a degrees of orientation to a (002) plane equal to 80%, 90%, and 99.7% respectively, to thermal oxidation under the thermal oxidation conditions shown in Table 1. Note that in FIGS. 9B and 9C the right sides of the figures correspond to top surfaces of zirconium oxide layers.

TABLE 1

| Sputtering Conditions | Temperature | RT |
|---|---|---|
| | Sputtering output [W] | 500 |
| | Sputtering pressure [Pa] | 0.5 |
| | Ar flow rate [sccm] | 30 |
| Thermal Oxidation Conditions | Temperature [degrees C.] | 900 |
| | Time [Hour] | 1 |
| | Load speed [mm/min] | 500 |

As shown in FIG. 7, while a peak of diffraction intensity corresponding to the (002) plane is extremely high on the zirconium layer according to this embodiment formed under the aforementioned sputtering conditions shown in Table 1, peaks of diffraction intensity corresponding to the (100) plane and the (101) plane are extremely low and substantially approximately equal to zero. Namely, a peak of diffraction intensity is observed substantially only in a portion corresponding to the (002) plane. From this result, it is confirmed that the zirconium layer according to this embodiment has extremely high degrees of orientation to the (002) plane. Note that the degrees of orientation to the (002) plane of this zirconium layer is specifically approximately 99.7%.

Moreover, as shown in FIG. 8, on the zirconium oxide layer formed by subjecting the zirconium layer of this embodiment to thermal oxidation, a peak of diffraction intensity is observed substantially only in a portion corresponding to the (−111) plane. Accordingly, it is confirmed that crystals of this zirconium oxide layer are subjected to priority orientation to a (−111) plane.

Furthermore, as shown in FIG. 9A, in the case of the zirconium oxide layer formed by subjecting the zirconium layer having a degrees of orientation to the (002) plane equal to 80% to thermal oxidation, ball-shaped crystals are observed, but basically crystals are formed into column-shaped ones. Additionally, as shown in FIG. 9B, in the case of the zirconium oxide layer formed by subjecting the zirconium layer having a degrees of orientation to the (002) plane equal to 90% to thermal oxidation, a certain amount of ball-shaped crystals are observed, for example, in a portion on the undersurface side and the like, but most crystals are formed into column-shaped ones. Moreover, as shown in FIG. 9C, in the case of the zirconium oxide layer formed by subjecting the zirconium layer having a degrees of orientation to the (002) plane equal to 99.7% to thermal oxidation, ball-shaped crystals are not observed, and crystals are formed into column-shaped ones substantially completely.

As obvious from these results, by subjecting the zirconium layer having a relatively high degrees of orientation to the (002) plane to thermal oxidation, the insulation film 55 (zirconium oxide layer) which is subjected to priority orientation to a (−111) plane can be formed. In addition, by subjecting the zirconium layer having a degrees of orientation to the (002) plane equal to 80% or more to thermal oxidation to form the insulation film 55, the insulation film 55 having crystals which are formed into column-shaped ones continuously from the undersurface to the top surface can be formed. Moreover, by setting the degrees of orientation to the (002) plane of the zirconium layer to be higher, preferably to 90% or more, the preferable insulation film 55 in which the rate of existence of column-shaped crystals is high can be formed.

Since the adhesion properties between the insulation film 55 and the elastic film 50 as described above are extremely high, the delamination of the vibration plate or the like can be prevented from occurring. Accordingly, an actuator device having increased the durability and reliability thereof and an inkjet recording head provided with the actuator device can be achieved.

Figure 10:
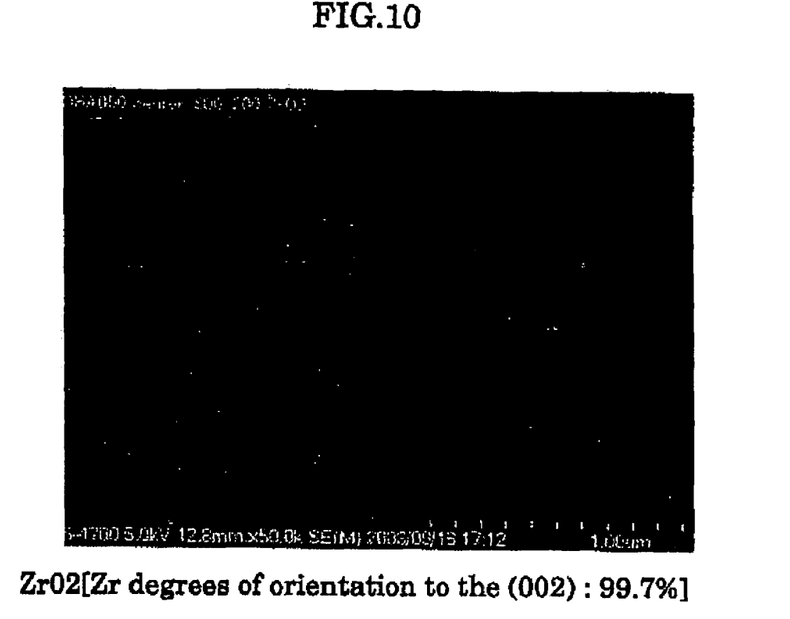
FIG. 10 is a scanning electron microscopic image showing a surface of a zirconium oxide layer according to Embodiment 1.
Figure 11:
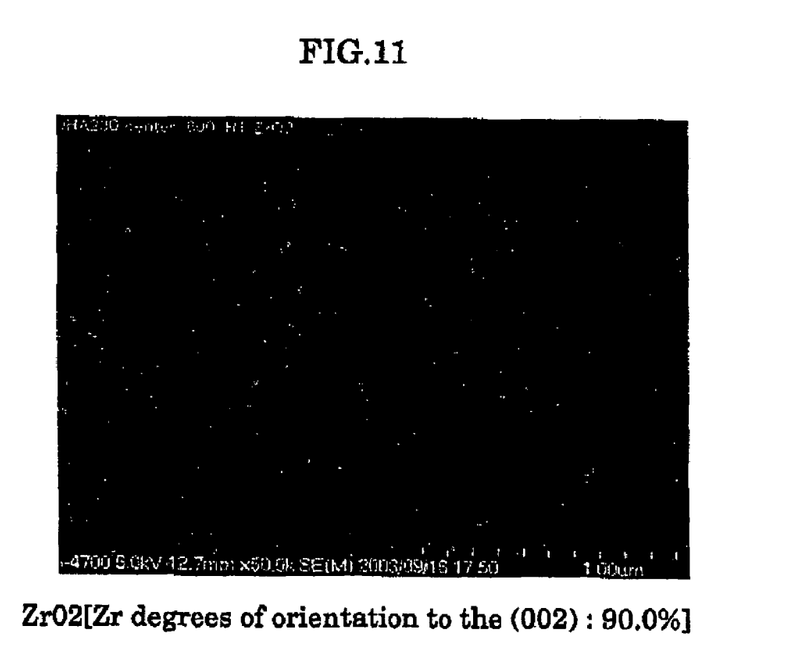
FIG. 11 is a scanning electron microscopic image showing a surface of another zirconium oxide layer according to Embodiment 1.

Note that, by controlling the degrees of orientation to the (002) plane of the zirconium layer, it is also possible to control the grain size of the insulation film 55 (zirconium oxide layer). A SEM image of the surface of the zirconium oxide layer formed by subjecting the zirconium layer having a degrees of orientation to the (002) plane equal to 99.7% to thermal oxidation is shown in FIG. 10. A SEM image of the surface of the zirconium oxide layer formed by subjecting the zirconium layer having a degrees of orientation to the (002) plane equal to 90% to thermal oxidation is shown in FIG. 11. As understood from the SEM image shown in FIG. 10, in the case of the zirconium oxide layer formed by subjecting the zirconium layer having a degrees of orientation to the (002) plane equal to 99.7% to thermal oxidation, the average grain size of zirconium oxide is approximately equal to 100 nm. Meanwhile, in the case of the zirconium oxide layer formed by subjecting the zirconium layer having a degrees of orientation to the (002) plane equal to 90% to thermal oxidation, as understood from the SEM image shown in FIG. 10, the average grain size of zirconium oxide is approximately equal to 50 nm, and it is smaller than that of the zirconium oxide in the case of the subjecting of zirconium layer having a degrees of orientation to the (002) plane equal to 99.7% to thermal oxidation.

Namely, the grain size of zirconium oxide varies depending on the degrees of orientation to the (002) plane of the zirconium layer before thermal oxidation. As the degrees of orientation to the (002) plane of the zirconium layer is set to be higher, the average grain size of zirconium oxide becomes larger. Accordingly, by controlling the degrees of orientation to the (002) plane of the zirconium layer, it is possible to control the average grain size of zirconium oxide constituting the insulation film 55. In addition, it is possible to control the average grain size of zirconium oxide surely in a range of about 20 to 100 nm, for example.

Figure 3D:
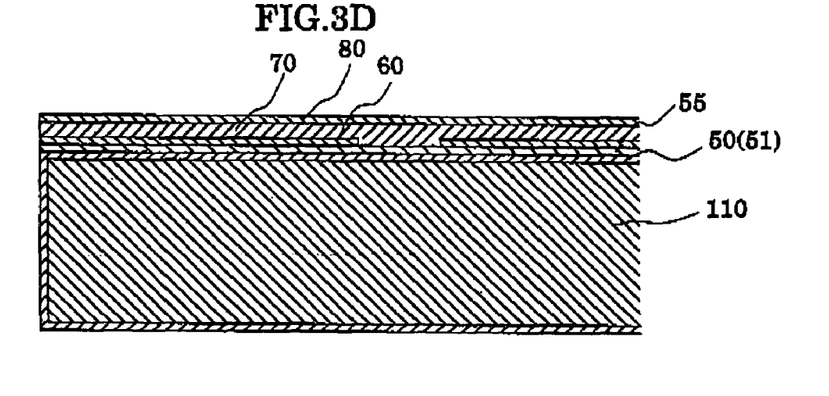

Note that after forming the insulation film 55 as described above, as shown in FIG. 3C, for example, platinum and iridium are laminated on the insulation film 55 to form the lower electrode film 60, and thereafter the lower electrode film 60 is patterned into a predetermined shape. Next, as shown in FIG. 3D, for example, the piezoelectric layer 70 made of lead zirconate titanate (PZT) and the upper electrode film 80 made of iridium, for example, is formed on the entire surface of the passage-forming substrate wafer 110. Here, in this embodiment, the piezoelectric layer 70 made of lead zirconate titanate (PZT) is formed by use of a so-called sol-gel method, in which so-called sol formed by dissolving and dispersing a metal-organic material into a solvent is coated and dried for gelation, and then by baking the material at a high temperature, the piezoelectric layer 70 made of metal oxide is obtained. When the piezoelectric layer 70 is formed as described above, the lead components of the piezoelectric layer 70 may diffuse in the elastic film 50 in baking. However, the insulation film 55 made of zirconium oxide is provided under the piezoelectric layer 70, and therefore the lead components of the piezoelectric layer 70 does not diffuse in the elastic film 50.

Figure 4A:
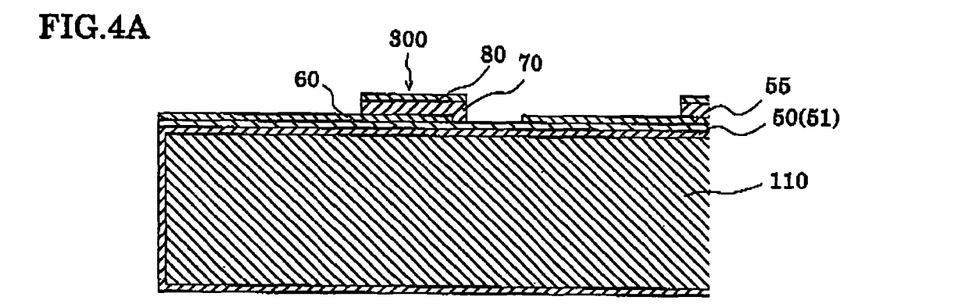
FIGS. 4A to 4D are cross-sectional views showing the manufacturing process of the recording head according to Embodiment 1.
Figure 4B:
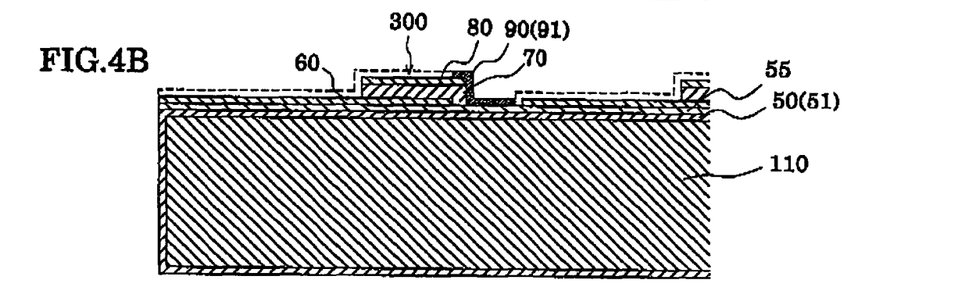

Subsequently, as shown in FIG. 4A, the piezoelectric layer 70 and the upper electrode film 80 are patterned into a region corresponding to each of the respective pressure generating chambers 12 to form the piezoelectric element 300. Next, the lead electrodes 90 are formed. To be more precise, a metal layer 91 made of gold (Au) or the like, for example, is formed on the entire surface of the passage-forming substrate wafer 110 as shown in FIG. 4B. Thereafter, the lead electrodes 90 are formed by patterning the metal layer 91 for the respective piezoelectric elements 300 through a mask pattern (unillustrated) made of resist or the like, for example.

Figure 4C:
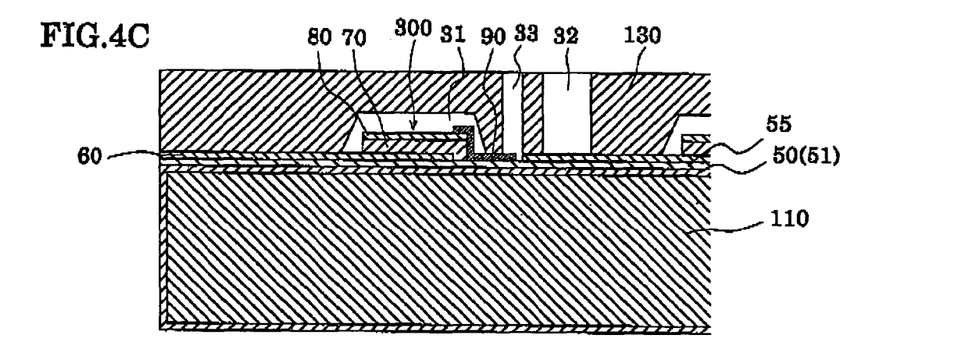

Next, as shown in FIG. 4C, a protective plate wafer 130 made of a silicon wafer and constituting a plurality of protective plates 30 is joined to the passage-forming substrate wafer 110 on the piezoelectric element 300 side. Here, this protective plate wafer 130 has a thickness of about 400 µm, for example. Accordingly, the stiffness of the passage-forming substrate wafer 110 is significantly increased by joining the protective plate wafer 130 thereto.

Figure 4D:
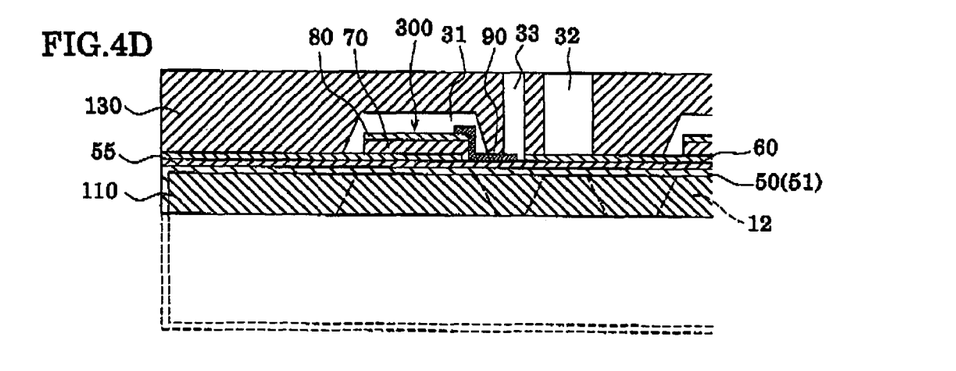
Figure 5A:
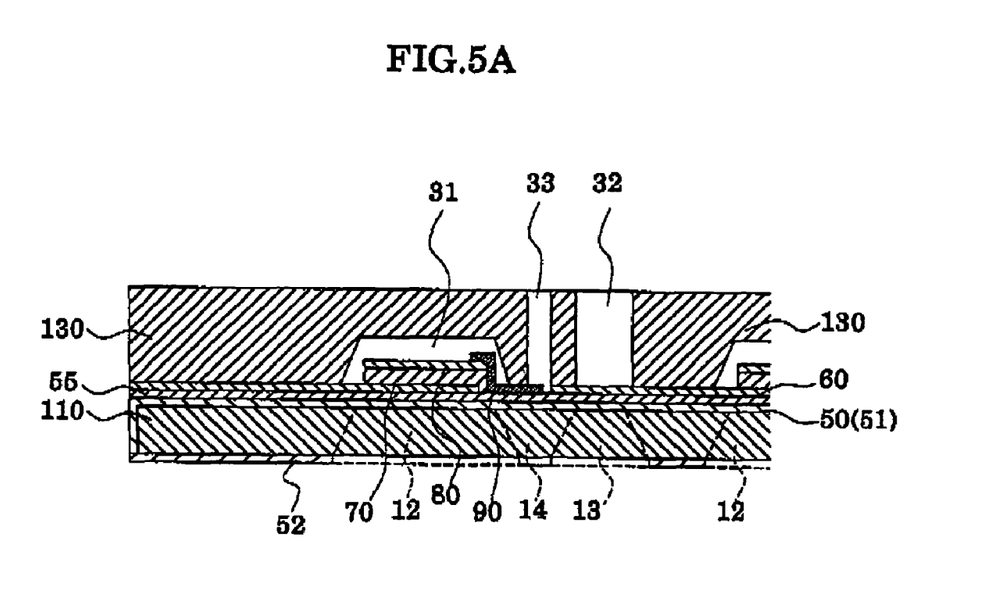
FIGS. 5A and 5B are cross-sectional views showing the manufacturing process of the recording head according to Embodiment 1.
Figure 5B:
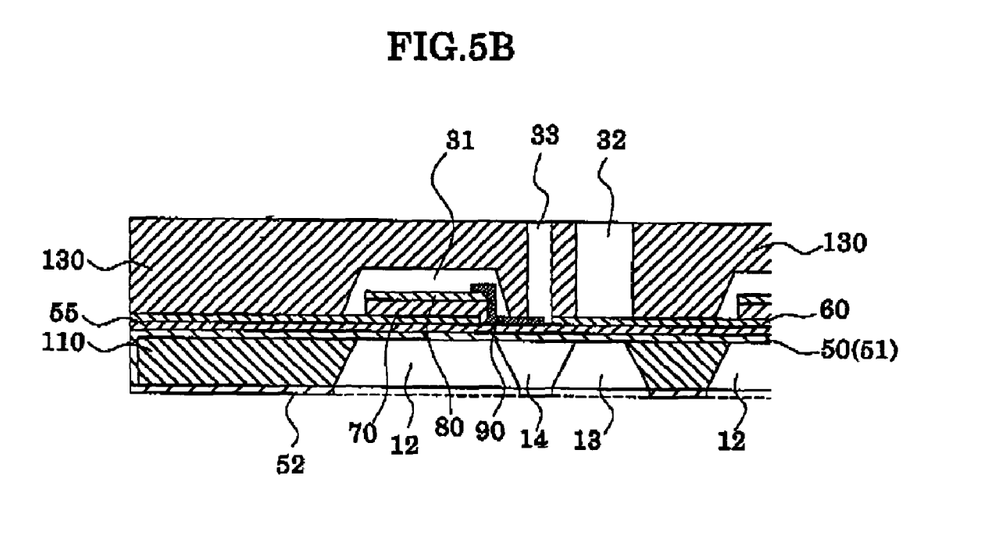

Subsequently, the passage-forming substrate wafer 110 is ground to a certain thickness as shown in FIG. 4D. Thereafter, the passage-forming substrate wafer 110 is further adjusted to a predetermined thickness by performing wet etching with hydrofluoric-nitric acid. For example, the passage-forming substrate wafer 110 is etched to adjust the thickness to about 70 µm in this embodiment. Subsequently, as shown in FIG. 5A, a mask film 52 made of silicon nitride (SiN), for example, is newly formed on the passage-forming substrate wafer 110, and the mask film 52 is patterned into a predetermined shape. Then, the passage-forming substrate wafer 110 is subjected to anisotropic etching through this mask film 52, whereby the pressure generating chambers 12, the communicating portion 13, the ink supply paths 14, and the like are formed on the passage-forming substrate wafer 110 as shown in FIG. 5B.

Note that, thereafter, unnecessary portions in the periphery portions of the passage-forming substrate wafer 110 and of the protective plate wafer 130 are cut out and removed by dicing or the like, for example. Then, the nozzle plate 20 having the nozzle orifices 21 drilled thereon is joined to the passage-forming substrate wafer 110 on the side opposite to the protective plate wafer 130. In addition, the compliance plate 40 is joined to the protective plate wafer 130, and then the passage-forming substrate wafer 110 and other constituents thereon are divided into the passage-forming substrates 10 or the like each having one chip size as shown in FIG. 1. In this way, the inkjet recording head of this embodiment is formed.

Other Embodiments

The present invention has been described above based on the respective embodiments. However, the present invention will not be limited only to the foregoing embodiments. For example, in the foregoing embodiments, the insulation film 55 has been formed on the elastic film 50. However, the insulation film 55 may be provided on a portion above the elastic film 50 toward the piezoelectric layer 70 side. For example, another layer may interpose between the elastic film 50 and the insulation film 55.

Figure 12:
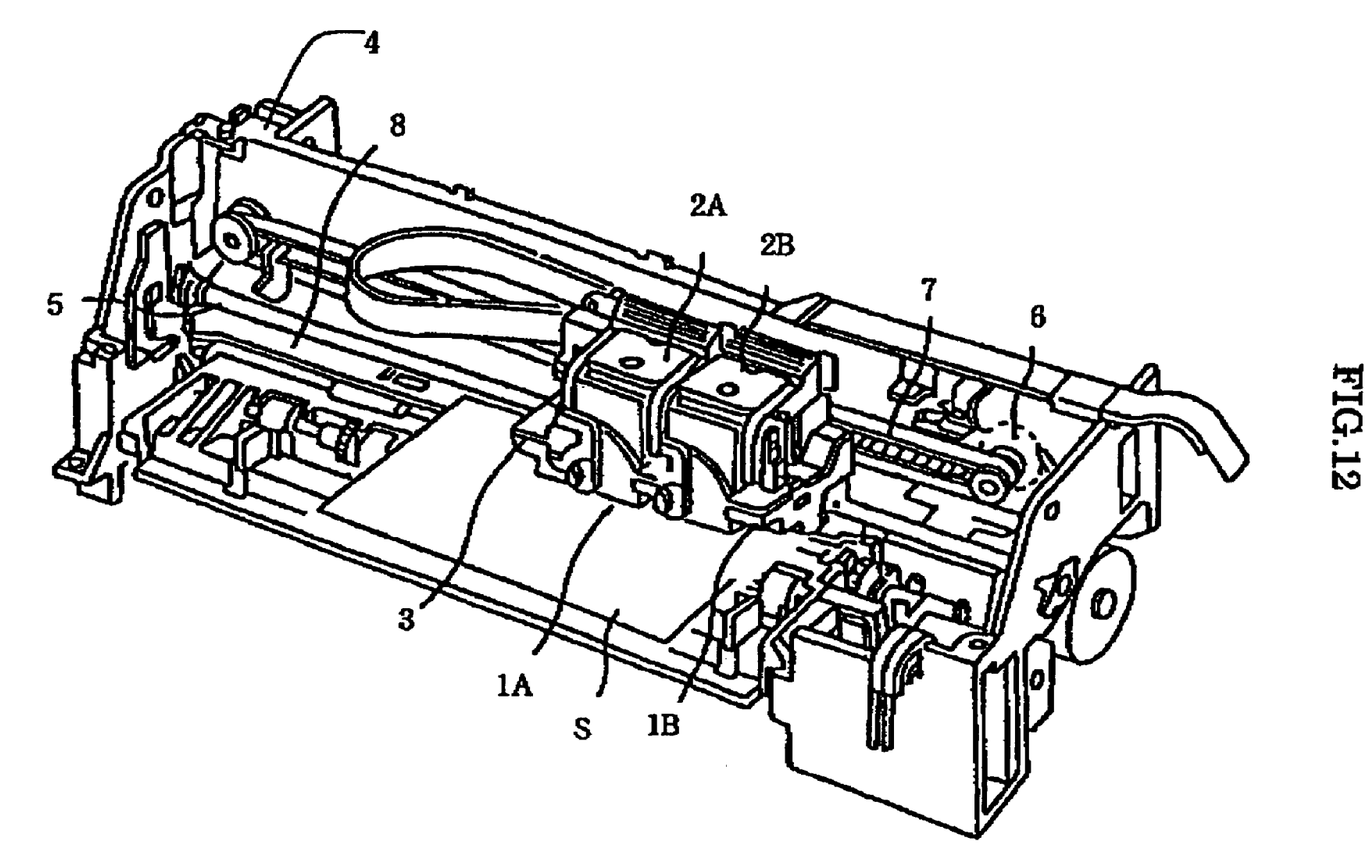
FIG. 12 is a schematic view of a recording apparatus according to an embodiment.

Moreover, the inkjet recording head of the foregoing embodiment constitutes a part of a recording head unit including an ink passage communicating with an ink cartridge and the like, and is applied to an inkjet recording apparatus. FIG. 12 is a schematic view showing an example of the inkjet recording apparatus.

As shown in FIG. 12, in recording head units 1A and 1B having inkjet recording heads, cartridges 2A and 2B constituting ink supply means are removably provided. A carriage 3 having these recording head units 1A and 1B mounted thereon is provided movably in an axial direction on a carriage shaft 5 attached to an apparatus main body 4. These recording head units 1A and 1B are, for example, ones which eject a black ink composition and a color ink composition, respectively. Driving force of a drive motor 6 is transmitted to the carriage 3 via a plurality of unillustrated gears and a timing belt 7. Thus, the carriage 3 having the recording head units 1A and 1B Mounted there on is moved along the carriage shaft 5. Meanwhile, a platen 8 is provided along the carriage shaft 5 in the apparatus main body 4, and a recording sheet S which is a recording medium such as paper fed by an unillustrated feed roller or the like is to be transferred on the platen 8.

Moreover, in the foregoing embodiment, the inkjet recording heads has been described as an example of the liquid jet head of the present invention. However, basic configurations of a liquid jet head will not be limited to the ones described above. The present invention is aimed widely at general liquid jet heads, and as a matter of course, can also be applied to ones ejecting liquids other than ink. As other liquid jet heads, cited are, for example: various kinds of recording heads used in an image recording apparatus such as a printer; a coloring material jet head used for manufacturing color filters of a liquid crystal display and the like; an electrode material jet head used for forming electrodes of an organic EL display, a field emission display (FED) and the like; a living organic material jet head used for manufacturing biochips; and the like.

Furthermore, needless to say, the present invention can be applied not only to an actuator device to be applied to a liquid jet head (inkjet recording head) but also to an actuator device to be applied to any apparatus.

What is claimed is:

1. An actuator device including a vibration plate, and piezoelectric elements formed of a lower electrode, a piezoelectric layer, and an upper electrode which are formed on the vibration plate,
   wherein the vibration plate comprises at least an insulation film made of zirconium oxide ($ZrO_2$), and crystals of the insulation film are subjected to priority orientation to a (−111) plane.

2. The actuator device according to claim 1, wherein crystals of the insulation film are column-shaped.

3. The actuator device according to claim 1, wherein the crystals of the insulation film are monoclinic.

4. The actuator device according to claim 1, wherein film thickness of the insulation film is 200 nm or more, and grain size is 20 to 100 nm.

5. The actuator device according to claim 1, wherein a stress of the insulation film is in a range of −150 to −300 [MPa].

6. The actuator device according to claim 1, wherein the vibration plate comprises an elastic film made of silicon dioxide ($SiO_2$), and the insulation film is formed on the elastic film.

7. A liquid jet apparatus comprising:

the liquid jet head having the actuator device according to claim 1.

* * * * *